US012660484B2

(12) United States Patent (10) Patent No.: US 12,660,484 B2
Shin et al. (45) Date of Patent: Jun. 16, 2026

(54) DISPLAY DEVICE

(71) Applicant: Samsung Display Co., LTD., Yongin-si (KR)

(72) Inventors: Hyuneok Shin, Gwacheon-si (KR); Juhyun Lee, Seongnam-si (KR); Joonyong Park, Gunpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 301 days.

(21) Appl. No.: 18/212,274

(22) Filed: Jun. 21, 2023

(65) Prior Publication Data

US 2023/0422586 A1 Dec. 28, 2023

(30) Foreign Application Priority Data

Jun. 24, 2022 (KR) ......................... 10-2022-0077410

(51) Int. Cl.
H10K 59/80 (2023.01)
H10K 59/35 (2023.01)
(52) U.S. Cl.
CPC ....... H10K 59/8792 (2023.02); H10K 59/352 (2023.02)
(58) Field of Classification Search
CPC .. H10K 59/8792; H10K 59/352; H10K 59/35; H10K 50/865; H10K 59/126; H10K 59/122; H10K 59/123; H10K 59/124; H10K 50/125; H10K 50/805
See application file for complete search history.

(56) References Cited

U.S. PATENT DOCUMENTS

| | | | |
|---|---|---|---|
| 7,397,485 | B2 | 7/2008 | Miller et al. |
| 2016/0093684 | A1 | 3/2016 | Youk et al. |
| 2020/0168844 | A1 | 5/2020 | Kim et al. |
| 2020/0321400 | A1 | 10/2020 | Park et al. |
| 2021/0217831 | A1 | 7/2021 | Jung et al. |

FOREIGN PATENT DOCUMENTS

| | | | | |
|---|---|---|---|---|
| JP | 2009104969 A | * | 5/2009 | ............. H10K 59/38 |
| KR | 1020160038559 A | | 4/2016 | |
| KR | 1020200117080 A | | 10/2020 | |

(Continued)

OTHER PUBLICATIONS

Extended European Search Report—European Patent Office for European Patent Application No. 23180836.1 dated Jan. 2, 2024, citing references listed within.

(Continued)

*Primary Examiner* — Elmito Breval
(74) *Attorney, Agent, or Firm* — CANTOR COLBURN LLP

(57) ABSTRACT

A display device includes: a substrate including a unit light emitting region; a transparent layer disposed on the substrate; and a light blocking pattern defined by a light blocking material filled in a groove defined through the transparent layer, where the light blocking pattern includes a first light blocking pattern overlapping the unit light emitting region and extending in a first direction when viewed in a plan view, and a second light blocking pattern overlapping the unit light emitting region and extending in a second direction crossing the first direction when viewed in the plan view.

23 Claims, 16 Drawing Sheets

(56)  References Cited

FOREIGN PATENT DOCUMENTS

| | | | |
|---|---|---|---|
| KR | 1020210092351 A | 7/2021 | |
| KR | 1020220012458 A | 2/2022 | |
| KR | 102376111 B1 | 3/2022 | |
| WO | WO-2023147709 A1 * | 8/2023 | ....... H10K 59/80515 |

OTHER PUBLICATIONS

Office Action dated Jan. 6, 2026 from the Korean Intellectual Property Office (KIPO) for Korean Patent Application No. 10-2022-0077410, 18 pages, w/translation.

\* cited by examiner

FIG. 3

F I G . 4
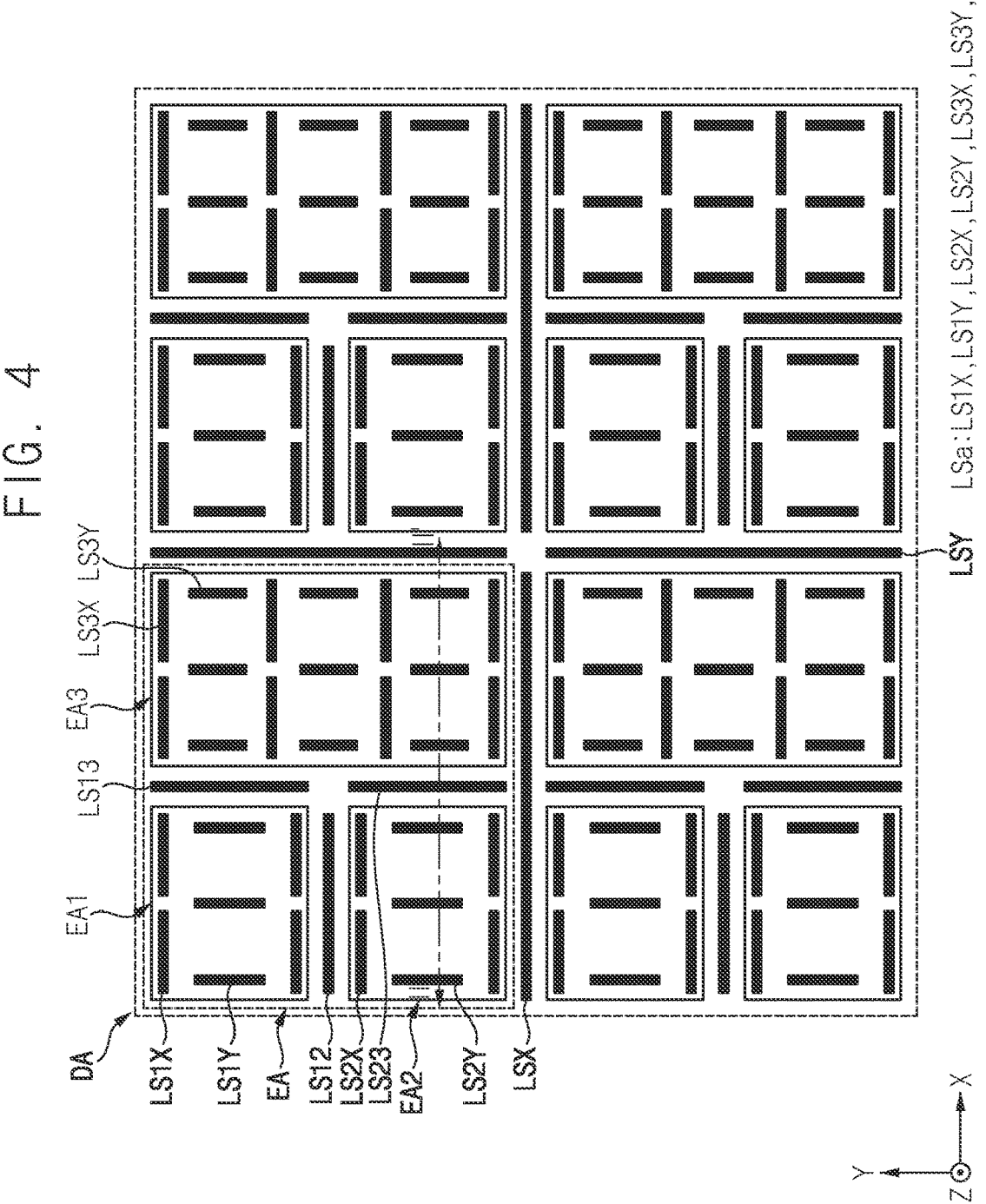
LSa:LS1X,LS1Y,LS2X,LS2Y,LS3X,LS3Y,LS12,LS13,LS23,LSX,LSY

FIG. 5

LSa:LS1X' ,LS1Y' ,LS2X' ,LS2Y' ,LS3X' ,LS3Y'

DISPLAY DEVICE

This application claims priority to Korean Patent Application No. 10-2022-0077410, filed on Jun. 24, 2022, and all the benefits accruing therefrom under 35 U.S.C. § 119, the content of which in its entirety is herein incorporated by reference.

BACKGROUND

1. Field

The disclosure relates to a display device that displays an image with a limited viewing angle.

2. Description of the Related Art

A display device refers to a device that displays an image and is applied to various electronic devices such as smartphones, digital cameras, laptop computers, navigation devices, and televisions.

In general, although the display device may be desired to display an image having a wide viewing angle, a viewing angle of the image displayed on the display device may be limited to ensure the security or privacy and to prevent image reflection.

SUMMARY

Embodiments of the disclosure provide a display device capable of efficiently limiting a viewing angle of an image.

A display device according to one embodiment of the disclosure includes: a substrate including a unit light emitting region; a transparent layer disposed on the substrate; and a light blocking pattern defined by a light blocking material filled in a groove defined through the transparent layer, where the light blocking pattern includes a first light blocking pattern overlapping the unit light emitting region and extending in a first direction when viewed in a plan view, and a second light blocking pattern overlapping the unit light emitting region and extending in a second direction crossing the first direction when viewed in the plan view.

In an embodiment, the unit light emitting region may include: a substrate including a unit light emitting region including a red light emitting region, a green light emitting region spaced apart from the red light emitting region when viewed in the plan view, and a blue light emitting region spaced apart from each of the red light emitting region and the green light emitting region when viewed in the plan view.

In an embodiment, the first light blocking pattern may include a plurality of first red light blocking patterns overlapping the red light emitting region when viewed in the plan view, a plurality of first green light blocking patterns overlapping the green light emitting region when viewed in the plan view, and a plurality of first blue light blocking patterns overlapping the blue light emitting region when viewed in the plan view, and the second light blocking pattern may include a plurality of second red light blocking patterns overlapping the red light emitting region when viewed in the plan view, a plurality of second green light blocking patterns overlapping the green light emitting region when viewed in the plan view, and a plurality of second blue light blocking patterns overlapping the blue light emitting region when viewed in the plan view.

In an embodiment, the plurality of first red light blocking patterns may be perpendicular to the plurality of second red light blocking patterns, respectively, when viewed in the plan view, the plurality of first green light blocking patterns may be perpendicular to the plurality of second green light blocking patterns, respectively, when viewed in the plan view, and the plurality of first blue light blocking patterns may perpendicular to the plurality of second blue light blocking patterns, respectively, when viewed in the plan view.

In an embodiment, the substrate may include: a plurality of pixel electrodes; a pixel defining layer disposed on the plurality of pixel electrodes, where a pixel opening is defined through the pixel defining layer to expose at least a part of each of the plurality of pixel electrodes; a plurality of light emitting layers disposed on the plurality of pixel electrodes in the pixel opening; and a common electrode covering the pixel defining layer and the plurality of light emitting layers.

In an embodiment, the each of the first light blocking pattern and the second light blocking pattern may overlap at least a part of the plurality of light emitting layers when viewed in the plan view.

In an embodiment, the light blocking pattern may further include a third light blocking pattern overlapping the pixel defining layer when viewed in a plan view and spaced apart from the plurality of light emitting layers when viewed in the plan view.

In an embodiment, the third light blocking pattern may be disposed between two adjacent light emitting layers among the plurality of light emitting layers when viewed in a plan view.

In an embodiment, the first light blocking pattern may be integrally formed with the second light blocking pattern as a single unitary and indivisible part.

In an embodiment, the display device may further include a transparent metal layer on the transparent layer.

In an embodiment, the groove may be defined further through the transparent metal layer, and the light blocking pattern may be defined by the light blocking material filled in the groove defined through the transparent layer and the transparent metal layer.

In an embodiment, the transparent layer may include a siloxane-based material or a silica-based material.

In an embodiment, a content of the silica-based material included in the transparent layer may be about 40 weight percent (wt %) or greater and about 70 wt % or less, based on a total weight of the transparent layer.

A display device according to another embodiment of the disclosure includes: a substrate including a unit light emitting region including a red light emitting region, a green light emitting region spaced apart from the red light emitting region when viewed in a plan view, and a blue light emitting region spaced apart from each of the red light emitting region and the green light emitting region when viewed in the plan view; a transparent layer disposed on the substrate; and a light blocking pattern defined by a light blocking material filled in a groove defined through the transparent layer, where the light blocking pattern includes a first light blocking pattern overlapping a portion of the red light emitting region and the blue light emitting region when viewed in the plan view and a second light blocking pattern overlapping a portion of the green light emitting region and the blue light emitting region when viewed in the plan view.

In an embodiment, the first light blocking pattern may extend in a first direction, and the second light blocking pattern may extend in a second direction crossing the first direction.

In an embodiment, an area of the blue light emitting region when viewed in the plan view may be larger than an area of the red light emitting region when viewed in the plan view, and larger than an area of the green light emitting region when viewed in the plan view.

In an embodiment, the substrate may include: a plurality of pixel electrodes; a pixel defining layer disposed on the plurality of pixel electrodes, where a pixel opening is defined through the pixel defining layer to expose at least a part of each of the plurality of pixel electrodes; a plurality of light emitting layers disposed on the plurality of pixel electrodes in the pixel opening; and a common electrode covering the pixel defining layer and the plurality of light emitting layers.

In an embodiment, the each of the first light blocking pattern and the second light blocking pattern may overlap at least a part of the plurality of light emitting layers when viewed in a plan view.

In an embodiment, the light blocking pattern may further include a third light blocking pattern overlapping the pixel defining layer when viewed in a plan view and spaced apart from the plurality of light emitting layers when viewed in a plan view.

In an embodiment, the third light blocking pattern may be disposed between two adjacent light emitting layers among the plurality of light emitting layers when viewed in a plan view.

A display device according to still another embodiment of the disclosure includes: a substrate including a unit light emitting region; a transparent layer disposed on the substrate; and a plurality of light blocking patterns defined by a light blocking material filled in a groove defined through the transparent layer, where the plurality of light blocking patterns includes a portion overlapping the unit light emitting region when viewed in a plan view, extending in a first direction when viewed in the plan view, and arranged in a second direction crossing the first direction.

In an embodiment, the plurality of light blocking patterns may include a first part and a second part, which are arranged in a zigzag manner along the first direction.

In an embodiment, each of the plurality of light blocking patterns may have a wavy shape extending in the first direction.

The display device according to embodiments of the disclosure includes the light blocking pattern overlapping at least a part of the unit light emitting region when viewed in the plan view. Accordingly, a viewing angle of light emitted from the unit light emitting region of the display device can be limited by the light blocking pattern.

However, the features of the disclosure is not limited to those described above, and may be expanded in various ways without departing from the spirit and scope of the disclosure.

BRIEF DESCRIPTION OF THE DRAWINGS

FIGS. 2 and 3 are views illustrating a display device according to an embodiment of the disclosure.

FIGS. 4 and 5 are views illustrating a display device according to an alternative embodiment of the disclosure.

FIGS. 11 to 16 are views for illustrating a method for manufacturing a display device according to an embodiment of the disclosure.

DETAILED DESCRIPTION

Figure 1:
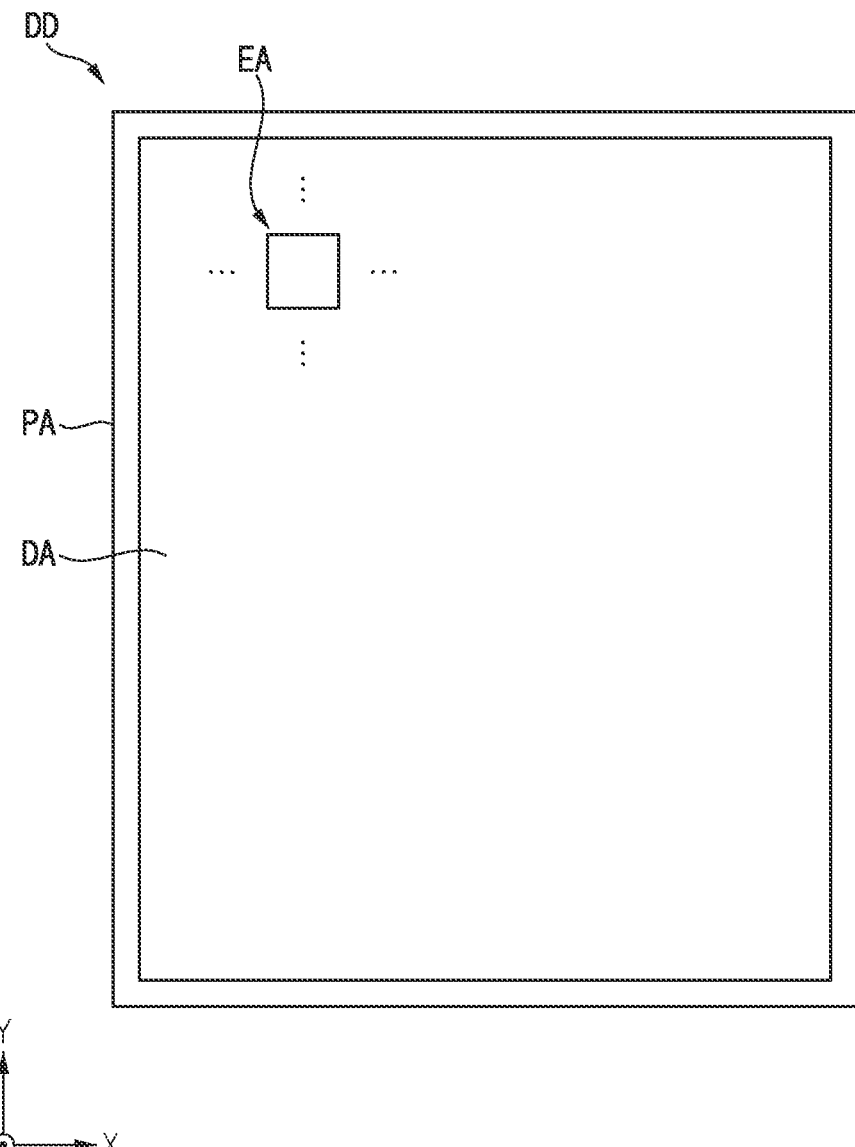
FIG. 1 is a plan view illustrating a display device according to embodiments of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

FIG. 1 is a plan view illustrating a display device according to embodiments of the disclosure.

Referring to FIG. 1, a display device DD according to embodiments of the disclosure may include a display region DA and a peripheral region PA.

The display region DA may be a region for displaying an image. The display region DA may include a unit light emitting region EA defined as a unit for displaying an image. Although FIG. 1 illustrates only one unit light emitting region EA in the display region DA for convenience of illustration, the display region DA may include a plurality of unit light emitting regions. The plurality of unit light emitting regions may be arranged along an X-axis and a Y-axis in the entire display region DA. Here, a Z-axis may be an axis perpendicular to the X-axis and the Y-axis, or a thickness direction of the display device DD.

At least one pixel may be disposed in the unit light emitting region EA. In an embodiment, a red sub-pixel that emits red light, a green sub-pixel that emits green light, and a blue sub-pixel that emits blue light may be disposed in the unit light emitting region EA.

The peripheral region PA may be adjacent to at least one side of the display region DA. In an embodiment, for example, as illustrated in FIG. 1, the peripheral region PA may surround the display region DA. A drive unit for driving the display device DD may be disposed in the peripheral region PA. In an embodiment, the peripheral region PA may be omitted.

Figure 2:
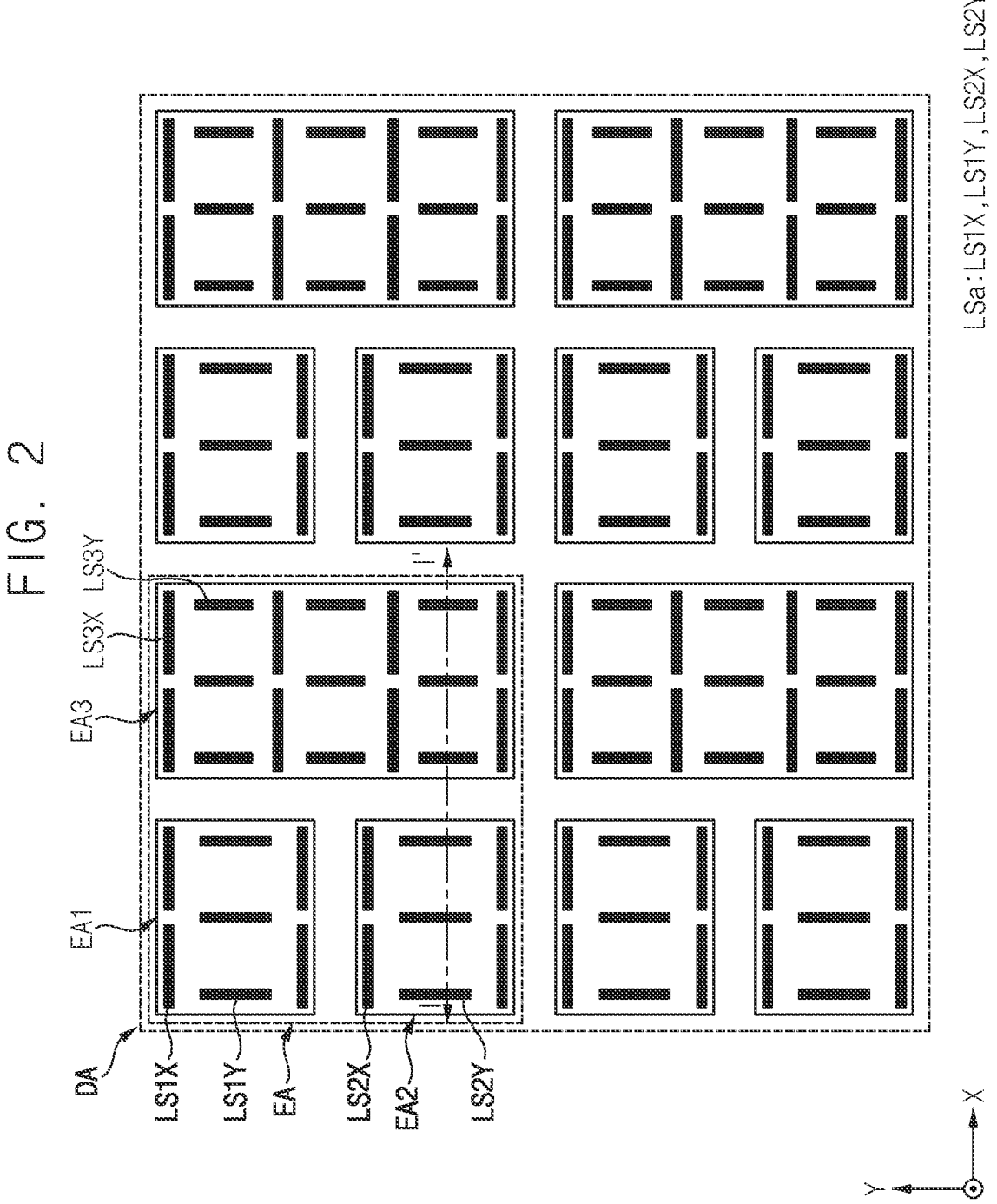
Figure 3:
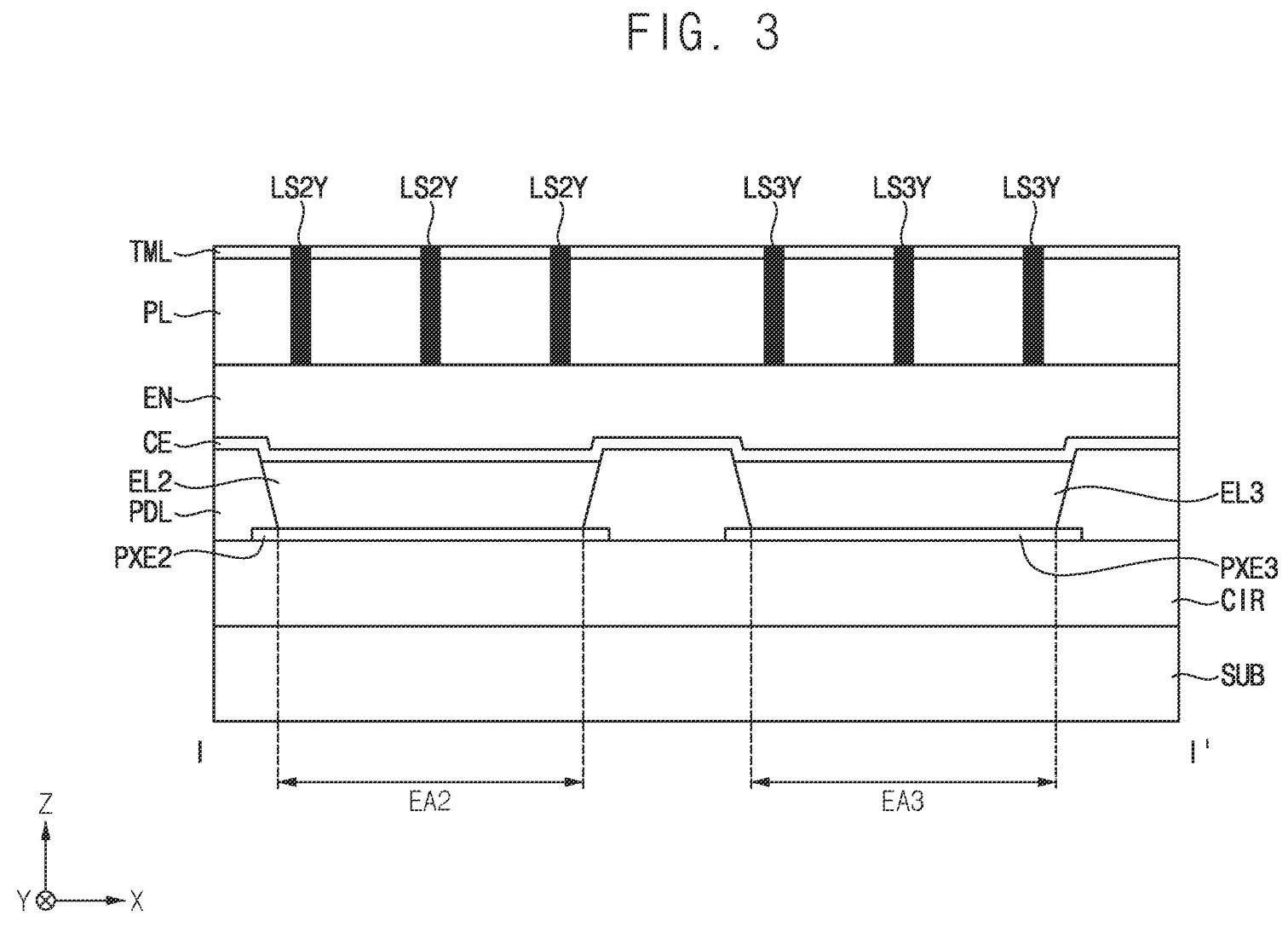

FIG. 2 is a plan view illustrating a display device according to an embodiment of the disclosure, and FIG. 3 is a sectional view taken along line I-I' in FIG. 2. FIG. 2 may be an enlarged plan view illustrating a part of the display region DA in FIG. 1.

Referring to FIG. 2, in an embodiment, a light blocking pattern LSa may be disposed in the unit light emitting region EA to overlap the unit light emitting region EA when viewed in a plan view in the Z-axis direction, i.e., when viewed in the Z-axis direction.

A red light emitting region EA1, a green light emitting region EA2, and a blue light emitting region EA3 may be disposed in the unit light emitting region EA. The red light emitting region EA1 may be a region that emits red light, the green light emitting region EA2 may be a region that emits green light, and the blue light emitting region EA3 may be a region that emits blue light. The red light emitting region EA1, the green light emitting region EA2, and the blue light emitting region EA3 may be disposed while being spaced apart from each other in the unit light emitting region EA.

In an embodiment, the light blocking pattern LSa may be a pattern that limits a viewing angle of light emitted from the unit light emitting region EA. In such an embodiment, the light blocking pattern LSa may include a plurality of patterns to efficiently limit the viewing angle of light emitted from the unit light emitting region EA.

In an embodiment, for example, the light blocking pattern LSa may include first light blocking patterns LS1X, LS2X, and LS3X and second light blocking patterns LS1Y, LS2Y, and LS3Y. The first light blocking pattern may extend in a first direction (e.g., the X-axis direction), and may be a pattern that limits a viewing angle in directions (e.g., the Y-axis direction) crossing the first direction. The second light blocking pattern may extend in a second direction (e.g., the Y-axis direction) crossing the first direction, and may be a pattern that limits a viewing angle in directions (e.g., the X-axis direction) crossing the second direction. As the light blocking pattern LSa includes the first light blocking pattern and the second light blocking pattern, the viewing angle of light emitted from the unit light emitting region EA in the directions crossing the first direction and the viewing angle of light emitted from the unit light emitting region EA in the directions crossing the second direction may be efficiently limited.

In an embodiment, the first light blocking pattern may include a plurality of first red light blocking patterns LS1X overlapping the red light emitting region EA1, a plurality of first green light blocking patterns LS2X overlapping the green light emitting region EA2, and a plurality of first blue light blocking patterns LS3X overlapping the blue light emitting region EA3, and the second light blocking pattern may include a plurality of second red light blocking patterns LS1Y overlapping the red light emitting region EA1, a plurality of second green light blocking patterns LS2Y overlapping the green light emitting region EA2, and a plurality of second blue light blocking patterns LS3Y overlapping the blue light emitting region EA3.

Each of the plurality of first red light blocking patterns LS1X may extend in the first direction, and each of the second red light blocking patterns LS1Y may extend in the second direction. The plurality of first red light blocking patterns LS1X and the plurality of second red light blocking patterns LS2Y may limit a viewing angle of red light emitted from the red light emitting region EA1. In an embodiment, the plurality of first red light blocking patterns LS1X may limit the viewing angle of red light emitted from the red light emitting region EA1 in the directions crossing the first direction, and the plurality of second red light blocking patterns LS2Y may limit the viewing angle of red light emitted from the red light emitting region EA1 in the directions crossing the second direction.

Each of the plurality of first green light blocking patterns LS2X may extend in the first direction, and each of the second green light blocking patterns LS2Y may extend in the second direction. The plurality of first green light blocking patterns LS2X and the plurality of second green light blocking patterns LS2Y may limit a viewing angle of green light emitted from the green light emitting region EA2.

Each of the plurality of first blue light blocking patterns LS3X may extend in the first direction, and each of the second blue light blocking patterns LS3Y may extend in the second direction. The plurality of first blue light blocking patterns LS3X and the plurality of second blue light blocking patterns LS2Y may limit a viewing angle of blue light emitted from the blue light emitting region EA3.

Although FIG. 2 illustrates an embodiment where four first red light blocking patterns LS1X and three second red light blocking patterns LS1Y overlap one red light emitting region EA1, the disclosure is not limited thereto. In an alternative embodiment, for example, two or more first red light blocking patterns LS1X and two or more second red light blocking patterns LS1Y may be disposed in one red light emitting region EA1. In such an embodiment, two or more first green light blocking patterns LS2X and two or more second green light blocking patterns LS2Y may be disposed in one green light emitting region EA2, and two or more first blue light blocking patterns LS3X and two or more second blue light blocking patterns LS3Y may be disposed in one blue light emitting region EA3.

Referring to FIG. 3, an embodiment of the display device DD may include a substrate SUB, a circuit layer CIR, a second pixel electrode PXE2, a third pixel electrode PXE3, a pixel defining layer PDL, a second light emitting layer EL2, a third light emitting layer EL3, a common electrode CE, an encapsulation layer EN, a transparent layer PL, a transparent metal layer TML, the plurality of second green light blocking patterns LS2Y, and the plurality of second blue light blocking patterns LS3Y.

The substrate SUB may include glass or plastic. In an embodiment, the substrate SUB may have a flexible property.

The circuit layer CIR may be disposed on the substrate SUB. The circuit layer CIR may include at least one insulating layer and at least one transistor. In an embodiment, for example, the circuit layer CIR may include transistors including a second drive transistor in the green light emitting region EA2 and a third drive transistor in the blue light emitting region EA3.

The second pixel electrode PXE2 and the third pixel electrode PXE3 may be disposed on the circuit layer CIR. Each of the second pixel electrode PXE2 and the third pixel electrode PXE3 may be electrically connected to the transistors included in the circuit layer CIR. In an embodiment, for example, the second pixel electrode PXE2 may be electrically connected to the second drive transistor, and the third pixel electrode PXE3 may be electrically connected to the third drive transistor. In an embodiment, each of the second pixel electrode PXE2 and the third pixel electrode PXE3 may be referred to as an anode electrode.

The pixel defining layer PDL may be disposed on the circuit layer CIR, the second pixel electrode PXE2, and the third pixel electrode PXE3. The pixel defining layer PDL may define a second pixel opening for exposing at least a part of the second pixel electrode PXE2 and a third pixel opening for exposing at least a part of the third pixel electrode PXE3. In FIG. 3, the second pixel opening may correspond to or define the green light emitting region EA2, and the third pixel opening may correspond to or define the blue light emitting region EA3. That is, the second pixel opening may be defined through the pixel defining layer PDL to expose at least a part of the second pixel electrode PXE2, and the third pixel opening may be defined through the pixel defining layer PDL to expose at least a part of the third pixel electrode PXE3.

The second light emitting layer EL2 may be disposed on the second pixel electrode PXE2 in the second pixel opening, and the third light emitting layer EL3 may be disposed on the third pixel electrode PXE3 in the third pixel opening. In an embodiment, each of the second light emitting layer EL2 and the third light emitting layer EL3 may include an organic light emitting material.

The common electrode CE may cover the pixel defining layer PDL, the second pixel electrode PXE2, and the third pixel electrode PXE3. In an embodiment, the common electrode CE may be referred to as a cathode electrode.

The second pixel electrode PXE2, the second light emitting layer EL2, and the common electrode CE may collectively define a second pixel. The second pixel may be a green sub-pixel that emits green light.

The third pixel electrode PXE3, the third light emitting layer EL3, and the common electrode CE may collectively define a third pixel. The third pixel may be a blue sub-pixel that emits blue light.

The encapsulation layer EN may cover the common electrode CE. In an embodiment, the encapsulation layer EN may include a first inorganic encapsulation layer disposed on the common electrode CE, an organic encapsulation layer disposed on the first inorganic encapsulation layer, and a second inorganic encapsulation layer disposed on the organic encapsulation layer.

The transparent layer PL may be disposed on the encapsulation layer EN. The transparent layer PL may include a material having relatively high light transmittance. In an embodiment, the transparent layer PL may include a siloxane-based material or a silica-based material. In such an embodiment, a content of the silica-based material included in the transparent layer PL may be about 40 weight percent (wt %) or greater and about 70 wt % or less, based on the total weight of the transparent layer PL.

The transparent metal layer TML may be disposed on the transparent layer PL. The transparent metal layer TML may include a metal oxide having relatively high light transmittance. In an embodiment, for example, the transparent metal layer TML may include indium gallium zinc oxide (IGZO), indium zinc oxide (IZO), or indium tin oxide (ITO). In an alternative embodiment, the transparent metal layer TML may be omitted.

Each of the plurality of second green light blocking patterns LS2Y and the plurality of second blue light patterns LS3Y may be disposed in a groove (or a hole) defined or formed through the transparent metal layer TML and the transparent layer TL. In an embodiment, where the transparent metal layer TML is omitted, the plurality of second green light blocking patterns LS2Y and the plurality of second blue light blocking patterns LS3Y may be disposed in a groove (or a hole) defined or formed through the transparent layer TL. In such an embodiment, as illustrated in FIG. 3, each of the plurality of second green light blocking patterns LS2Y and the plurality of second blue light blocking patterns LS3Y may extend in the Z-axis direction in the groove. The plurality of second green light blocking patterns LS2Y and the plurality of second blue light blocking patterns LS3Y may include a light blocking material. In an embodiment, for example, each of the plurality of second green light blocking patterns LS2Y and the plurality of second blue light blocking patterns LS3Y may have an organic material having relatively low light transmittance and relatively high light absorptivity.

Although FIG. 3 illustrates only a section of the green light emitting region EA2 or a section of the blue light emitting region EA3, a section of the red light emitting region EA1 (not illustrated in FIG. 3) may be substantially similar to the section of the green light emitting region EA2 or the section of the blue light emitting region EA3.

Figure 5:
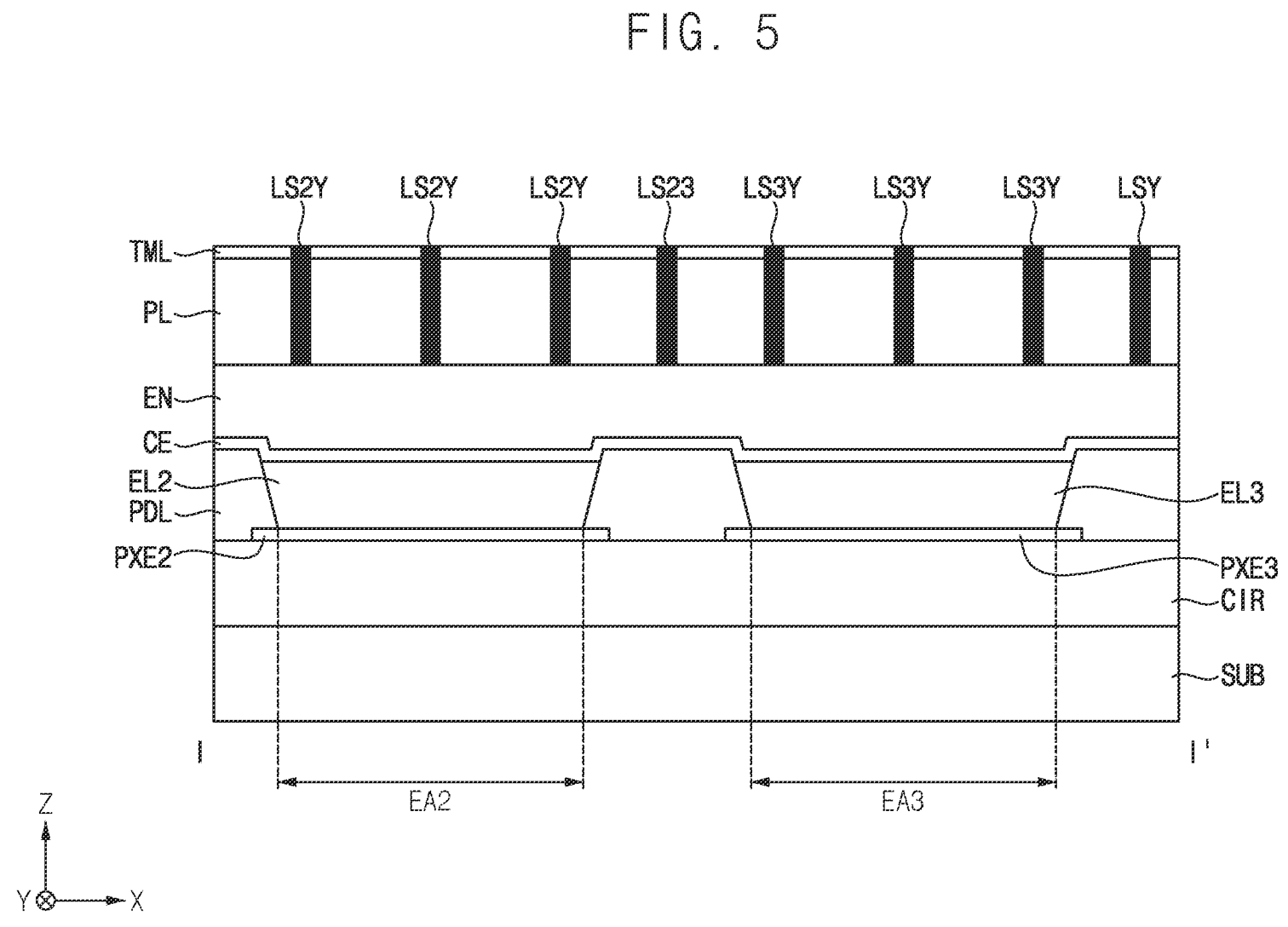

FIG. 4 is a plan view illustrating a display device according to an alternative embodiment of the disclosure, and FIG. 5 is a sectional view taken along line I-I' in FIG. 4. FIG. 4 may be an enlarged plan view illustrating a part of the display region DA in FIG. 1. Hereinafter, any repetitive detailed descriptions of the same or like elements in FIGS. 4 and 5 as those described above with reference to FIGS. 2 and 3 may be omitted.

to the embodiment of FIGS. 4 and 5 is substantially the same as the embodiment of FIGS. 2 and 3 except that the light blocking pattern LSa further includes a third light blocking pattern overlapping the pixel defining layer PDL. The third light blocking pattern may be disposed between two adjacent light emitting layers (e.g., EL2 and EL3). In such an embodiment, the third light blocking pattern may be disposed while being space apart from the red light emitting region EA1, the green light emitting region EA2, and the blue light emitting region EA3, when viewed in a plan view. Accordingly, the third light blocking pattern may limit a viewing angle of an image displayed on the display device DD, and also prevent color mixing of light emitted from the two adjacent light emitting layers.

The third light blocking pattern may include a first sub-light blocking pattern LS12, a second sub-light blocking pattern LS13, a third sub-light blocking pattern LS23, a fourth sub-light blocking pattern LSX, and a fifth sub-light blocking pattern LSY.

The first sub-light blocking pattern LS12 may be disposed between the red light emitting region EA1 and the green light emitting region EA2. The first sub-light blocking pattern LS12 may limit a viewing angle of light emitted from each of the red light emitting region EA1 and the green light emitting region EA2, and also prevent color mixing of light emitted from the red light emitting region EA1 and the green light emitting region EA2, The second sub-light blocking pattern LS13 may be disposed between the red light emitting region EA1 and the blue light emitting region EA3. The second sub-light blocking pattern LS13 may limit a viewing angle of light emitted from each of the red light emitting region EA1 and the blue light emitting region EA3, and also prevent color mixing of light emitted from the red light emitting region EA1 and the blue light emitting region EA3.

The third sub-light blocking pattern LS23 may be disposed between the green light emitting region EA2 and the blue light emitting region EA3. The third sub-light blocking pattern LS23 may limit a viewing angle of light emitted from each of the green light emitting region EA2 and the blue light emitting region EA3, and also prevent color mixing of light emitted from the green light emitting region EA2 and the blue light emitting region EA3.

Each of the fourth sub-light blocking pattern LSX and the fifth sub-light blocking pattern LSY may be disposed between two adjacent unit light emitting regions. In an embodiment, for example, the fourth sub-light blocking pattern LSX may be adjacent to one side of the unit light emitting region EA, and the fifth sub-light blocking pattern LSY may be adjacent to another end adjacent to the one side of the unit light emitting region EA. Each of the fourth sub-light blocking pattern LSX and the fifth sub-light blocking pattern LSY may limit a viewing angle of light emitted from each of the two adjacent unit light emitting regions, and also prevent color mixing of light emitted from the two adjacent unit light emitting regions.

Figure 6:
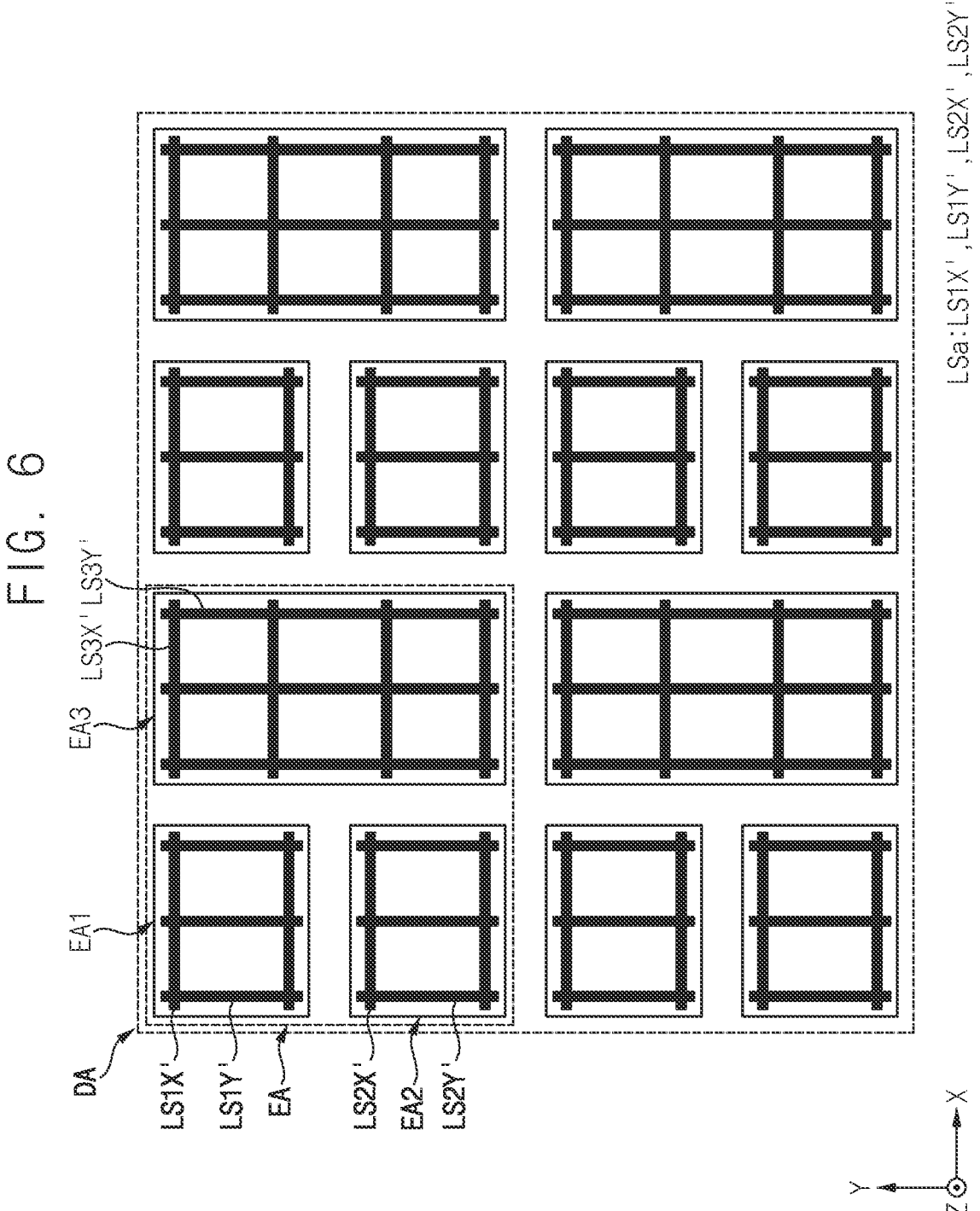
FIG. 6 is a plan view illustrating a display device according to another alternative embodiment of the disclosure.

FIG. 6 is a plan view illustrating a display device according to another alternative embodiment of the disclosure. FIG. 6 may be an enlarged plan view illustrating a part of the display region DA in FIG. 1. Hereinafter, any repetitive detailed descriptions of the same or like elements in FIG. 6 as those described above with reference to FIGS. 2 and 3 may be omitted.

Referring to FIG. 6, in another alternative embodiment, the light blocking pattern LSa may be integrally formed. In an embodiment, for example, a plurality of first red light blocking patterns LS1X may be integrally formed with a plurality of second red light blocking patterns LS1Y' as a single unitary and indivisible part, a plurality of first green light blocking patterns LS2X' may be integrally formed with a plurality of second green light blocking patterns LS2Y' as a single unitary and indivisible part, and a plurality of first blue light blocking patterns LS3X' may be integrally formed with a plurality of second blue light blocking patterns LS3Y' as a single unitary and indivisible part.

In such an embodiment, the plurality of first red light blocking patterns LS1X' and the plurality of second red light blocking patterns LS1Y' may have a mesh shape overlapping the red light emitting region EA1 when viewed in a plan view, the plurality of first green light blocking patterns LS2X' and the plurality of second green light blocking patterns LS2Y' may have a mesh shape overlapping the green light emitting region EA2 when viewed in a plan view, and the plurality of first blue light blocking patterns LS3X' and the plurality of second blue light blocking patterns LS3Y' may have a mesh shape overlapping the blue light emitting region EA3 when viewed in a plan view.

Figure 7:
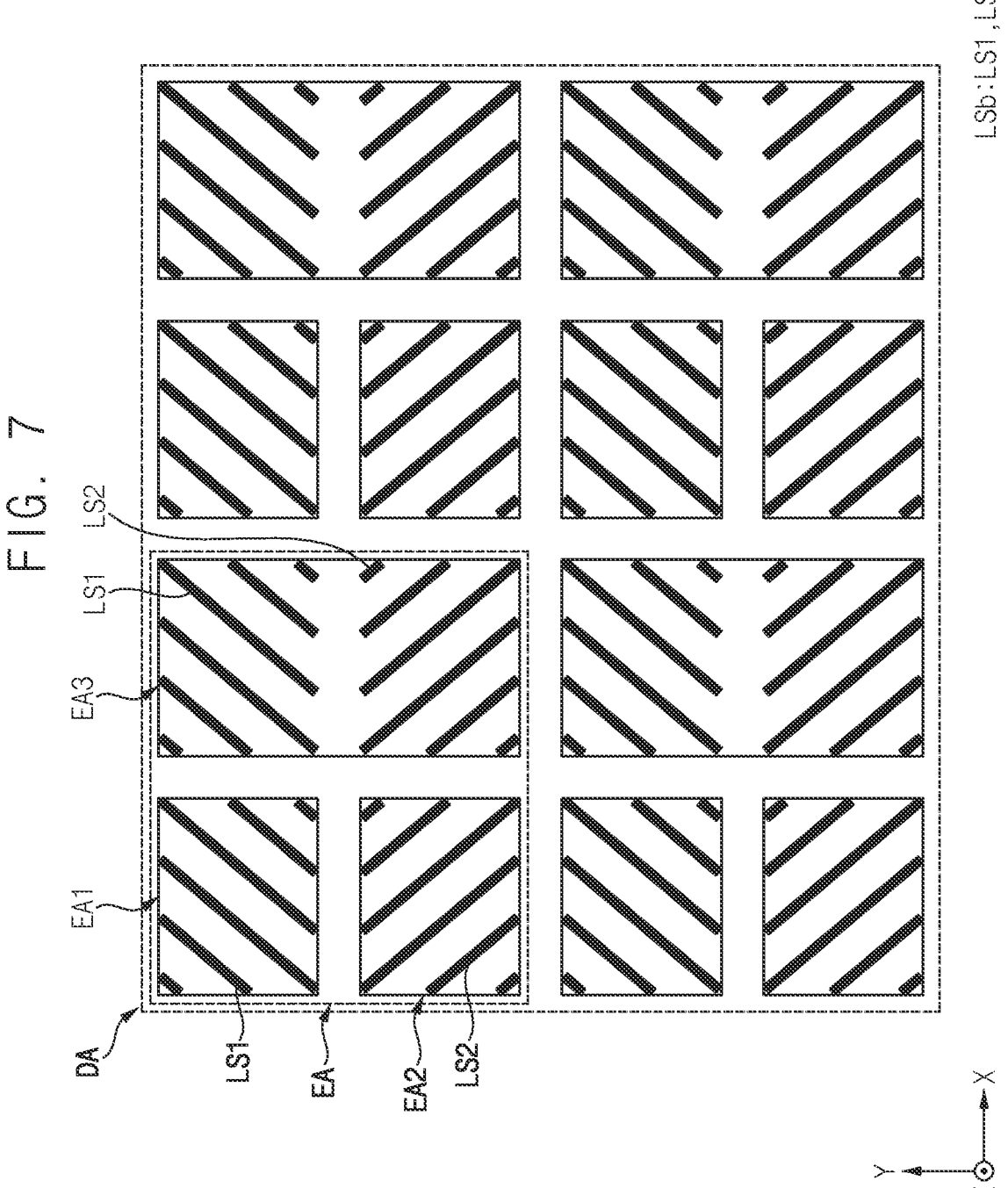
FIG. 7 is a plan view illustrating a display device according to another alternative embodiment of the disclosure.

FIG. 7 is a plan view illustrating a display device according to another alternative embodiment of the disclosure. FIG. 7 may be an enlarged plan view illustrating a part of the display region DA in FIG. 1. Hereinafter, any repetitive detailed descriptions of the same or like elements in FIG. 7 as those described above with reference to FIGS. 2 and 3 may be omitted.

Referring to FIG. 7, in an alternative embodiment, the unit light emitting region EA may include the green light emitting region EA2, the red light emitting region EA1, and the blue light emitting region EA3, and in such an embodiment, an area of the blue light emitting region EA3 when viewed in a plan view may be larger than an area of the green light emitting region EA2 and larger than an area of the red light emitting region EA1. In addition, a light blocking pattern LSb may include a first light blocking pattern LS1 and a second light blocking pattern LS2.

The first light blocking pattern LS1 may extend in a third direction (e.g., direction crossing the X-axis and the Y-axis on a same plane). The first light blocking pattern LS1 may overlap a part of the green light emitting region EA2 and the blue light emitting region EA3.

The second light blocking pattern LS2 may extend in a fourth direction (e.g., direction crossing the X-axis, the Y-axis, and the third direction on a same plane). The second light blocking pattern LS2 may overlap another part of the red light emitting region EA1 and the blue light emitting region EA3.

Figure 8:
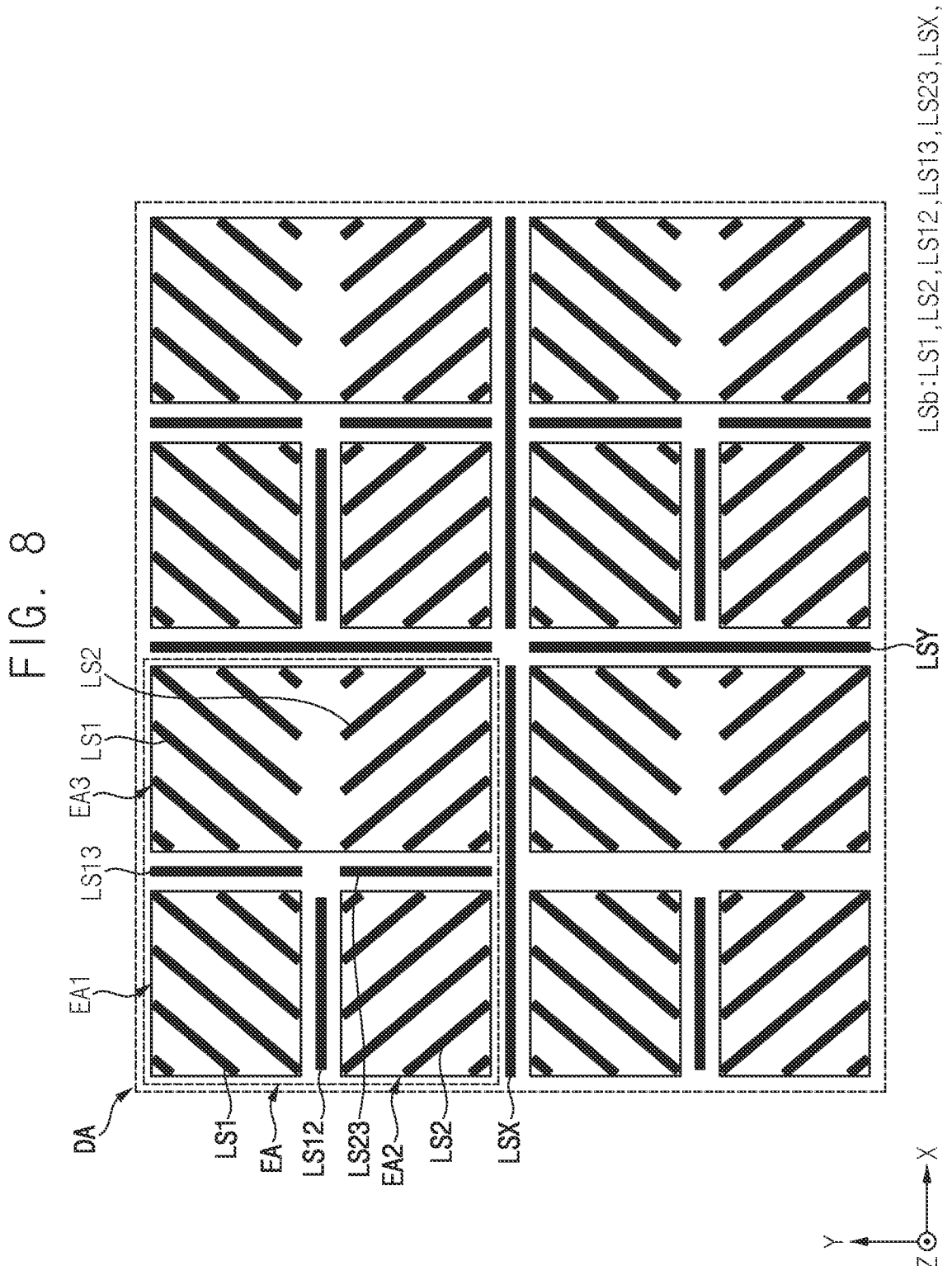
FIG. 8 is a plan view illustrating a display device according to another alternative embodiment of the disclosure.

FIG. 8 is a plan view illustrating a display device according to another alternative embodiment of the disclosure. FIG. 8 may be an enlarged plan view illustrating a part of the display region DA in FIG. 1. Hereinafter, any repetitive detailed descriptions of the same or like elements in FIG. 8 as those described above with reference to FIGS. 2 to 5 and 7 may be omitted.

The embodiment of FIG. 8 is substantially the same as the embodiment of FIG. 7 except that the light blocking pattern LSb further includes a first sub-light blocking pattern LS12, a second sub-light blocking pattern LS13, a third sub-light blocking pattern LS23, a fourth sub-light blocking pattern LSX, and a fifth sub-light blocking pattern LSY. Accordingly, the light blocking pattern LSb may limit a viewing angle of an image displayed on the display device DD, and also prevent color mixing of light emitted from the two adjacent light emitting layers.

Figure 9:
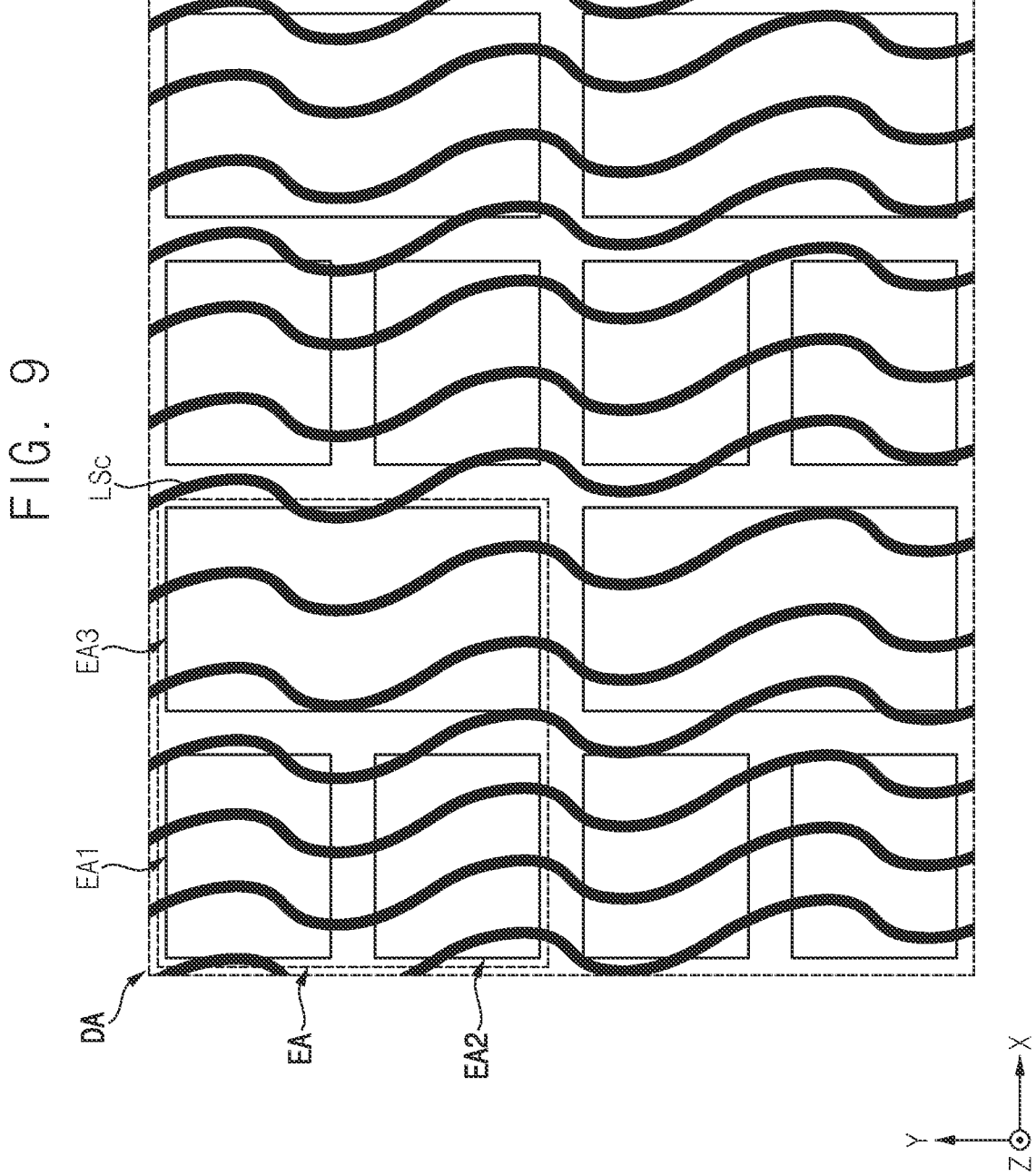
FIGS. 9 and 10 are plan views illustrating a display device according to other alternative embodiments of the disclosure.
Figure 10:
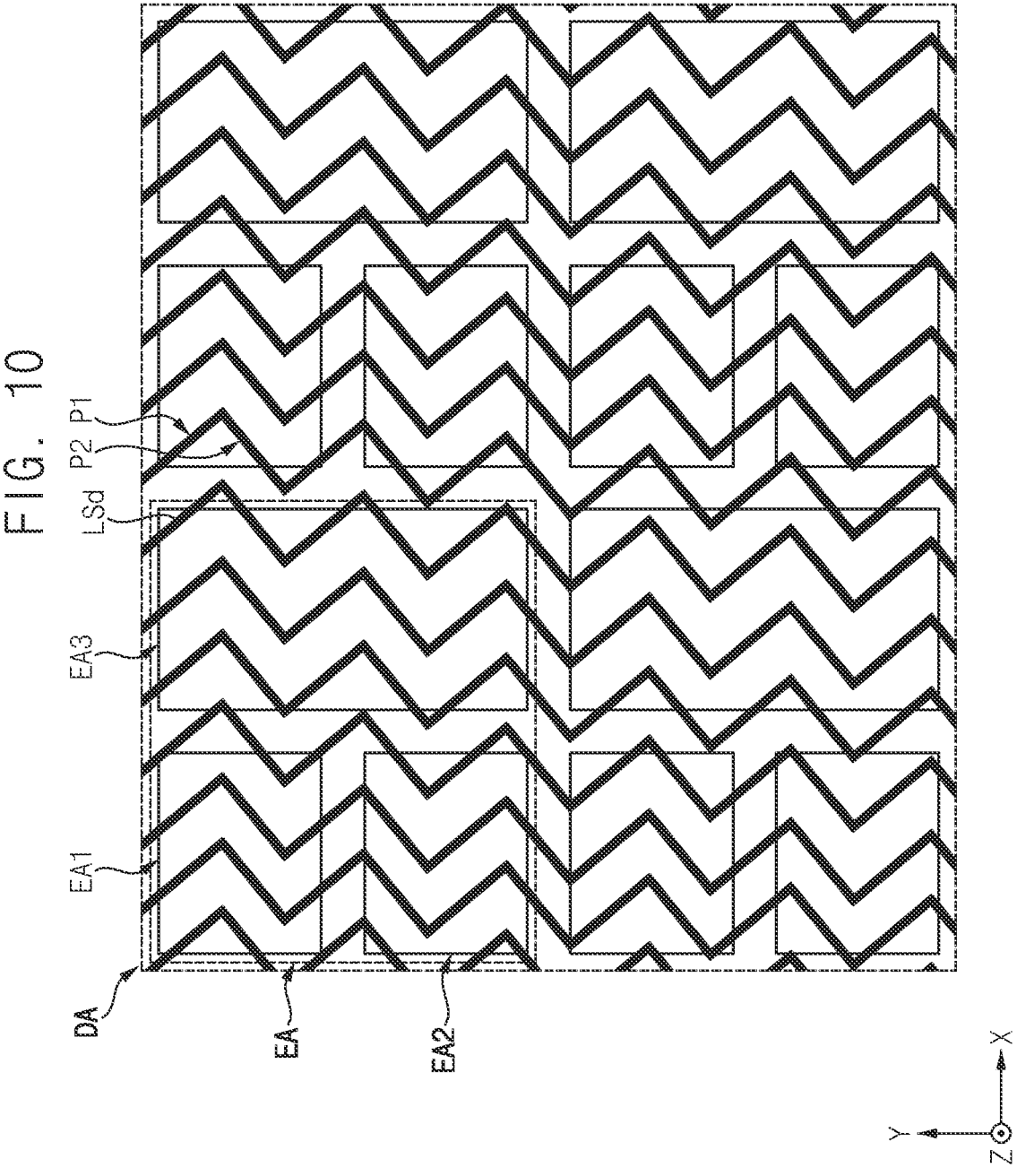

FIGS. 9 and 10 are plan views illustrating a display device according to other alternative embodiment of the disclosure. FIGS. 9 and 10 may be enlarged plan views illustrating a part of the display region DA in FIG. 1, respectively. Hereinafter, any repetitive detailed descriptions of the same or like elements in FIGS. 9 and 10 as those described above with reference to FIGS. 2 and 3 may be omitted.

Referring to FIG. 9, in another alternative embodiment, the display device DD may include a plurality of light blocking patterns LSc. Each of the plurality of light blocking patterns LSc may have a wavy shape extending in one direction when viewed in a plan view. In addition, the plurality of light blocking patterns LSc may be arranged in another direction crossing the one direction.

Referring to FIG. 10, in another alternative embodiment, the display device DD may include a plurality of light blocking patterns LSd. Each of the plurality of light blocking patterns LSd may include a first part P1 and a second part P2, which are arranged in a zigzag manner along one direction when viewed in a plan view. In addition, the plurality of light blocking patterns LSd may be arranged in another direction crossing the one direction.

FIGS. 11 to 16 are views for illustrating a method for manufacturing a display device according to an embodiment of the disclosure.

Figure 11:
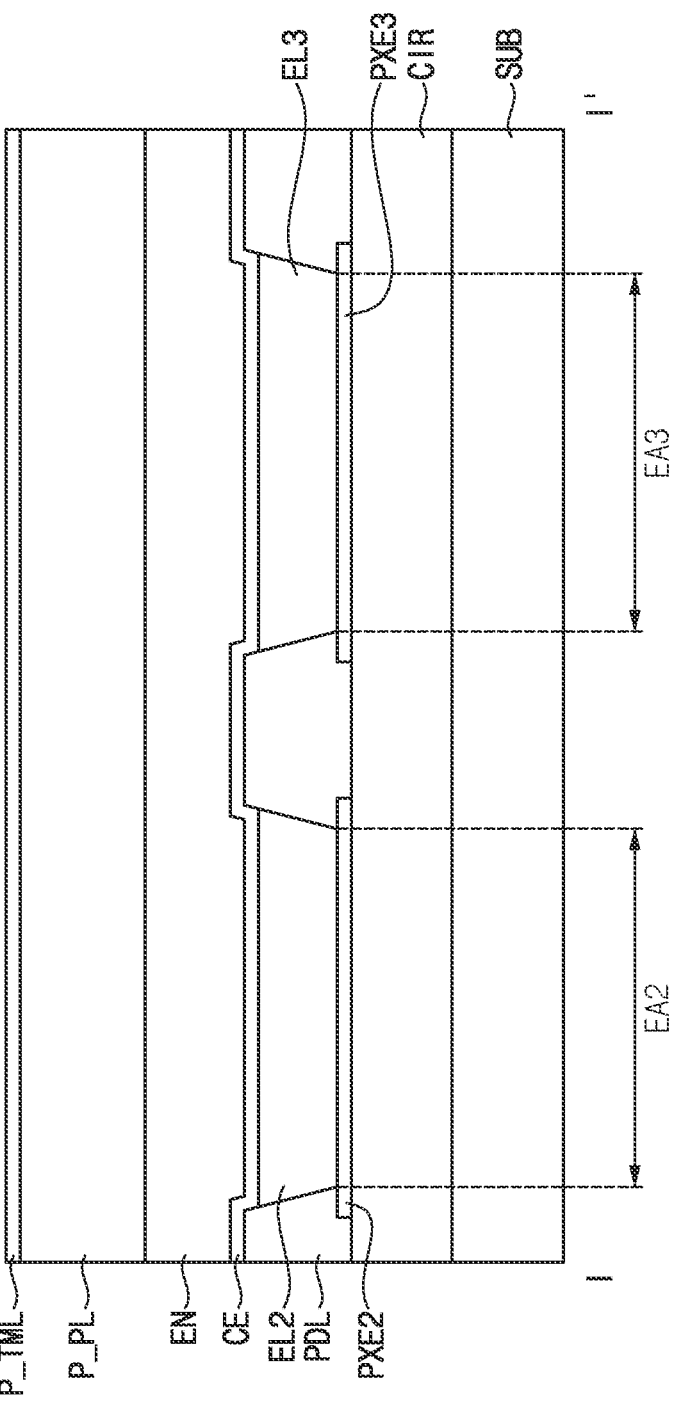

Referring to FIG. 11, in an embodiment, a panel including include a substrate SUB, a circuit layer CIR, a second pixel electrode PXE2, a third pixel electrode PXE3, a pixel defining layer PDL, a second light emitting layer EL2, a third light emitting layer EL3, a common electrode CE, an encapsulation layer EN is prepared. Then, a preliminary transparent layer P_PL may be provided or formed on the encapsulation layer EN. In an embodiment, the preliminary transparent layer P_PL may be formed by coating the encapsulation layer EN with a silica-based material and a siloxane-based material, and then baking the encapsulation layer EN at relatively low temperature. In this process, the preliminary transparent layer P_PL may not include a photosensitive material (e.g., photoresist material).

In an embodiment of the disclosure, the preliminary transparent layer P_PL may include a silica-based material or a siloxane-based material and may not include a photosensitive material. Accordingly, the preliminary transparent layer P_PL may be efficiently cured at relatively low temperature and have relatively high light transmittance and a high out-gassing property.

In an embodiment, a content of the silica-based material included in the preliminary transparent layer P_PL may be about 40 wt % or greater and about 70 wt % or less, based on the total weight of the preliminary transparent layer P_PL. If the content of the silica-based material included in the preliminary transparent layer P_PL may be less than about 40 wt %, the light transmittance of the preliminary transparent layer P_PL may be relatively lowered. In addition, if the content of the silica-based material included in the preliminary transparent layer P_PL may be greater than about 70 wt %, an upper surface of the preliminary transparent layer P_PL may not be substantially flat, and the preliminary transparent layer P_PL may not be sufficiently removed in a dry etching process to be described later.

After providing or forming the preliminary transparent layer P_PL, a preliminary transparent metal layer P_TML may be provided or formed on the preliminary transparent layer P_PL. In an embodiment, the preliminary transparent metal layer P_TML may be formed by forming a transparent metal oxide (e.g., IGZO, IZO, or ITO) on the entire preliminary transparent layer P_PL using known methods.

Figure 12:
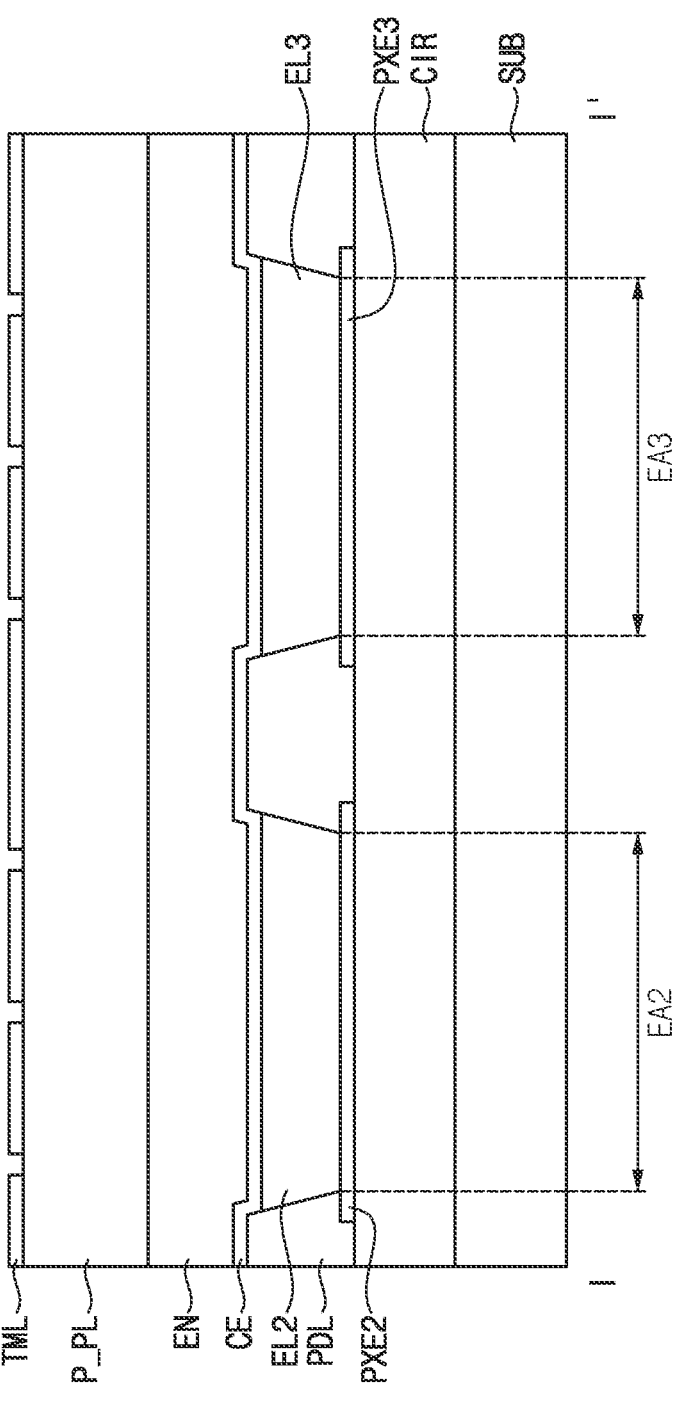

Referring to FIG. 12, a transparent metal layer TML may be formed by removing a part of the preliminary transparent metal layer P_TML. In this process, the part of the preliminary transparent metal layer P_TML may be removed to correspond to a shape of the light blocking pattern when viewed in a plan view, which has been described with reference to FIGS. 2, 4, 6, 7, 8, and 9. In an embodiment, the part of the preliminary transparent metal layer P_TML may be removed by a dry etching method using an etchant. In this process, as illustrated in FIG. 12, the preliminary transparent layer P_PL disposed below the preliminary transparent metal layer P_TML may not be substantially removed.

Figure 13:
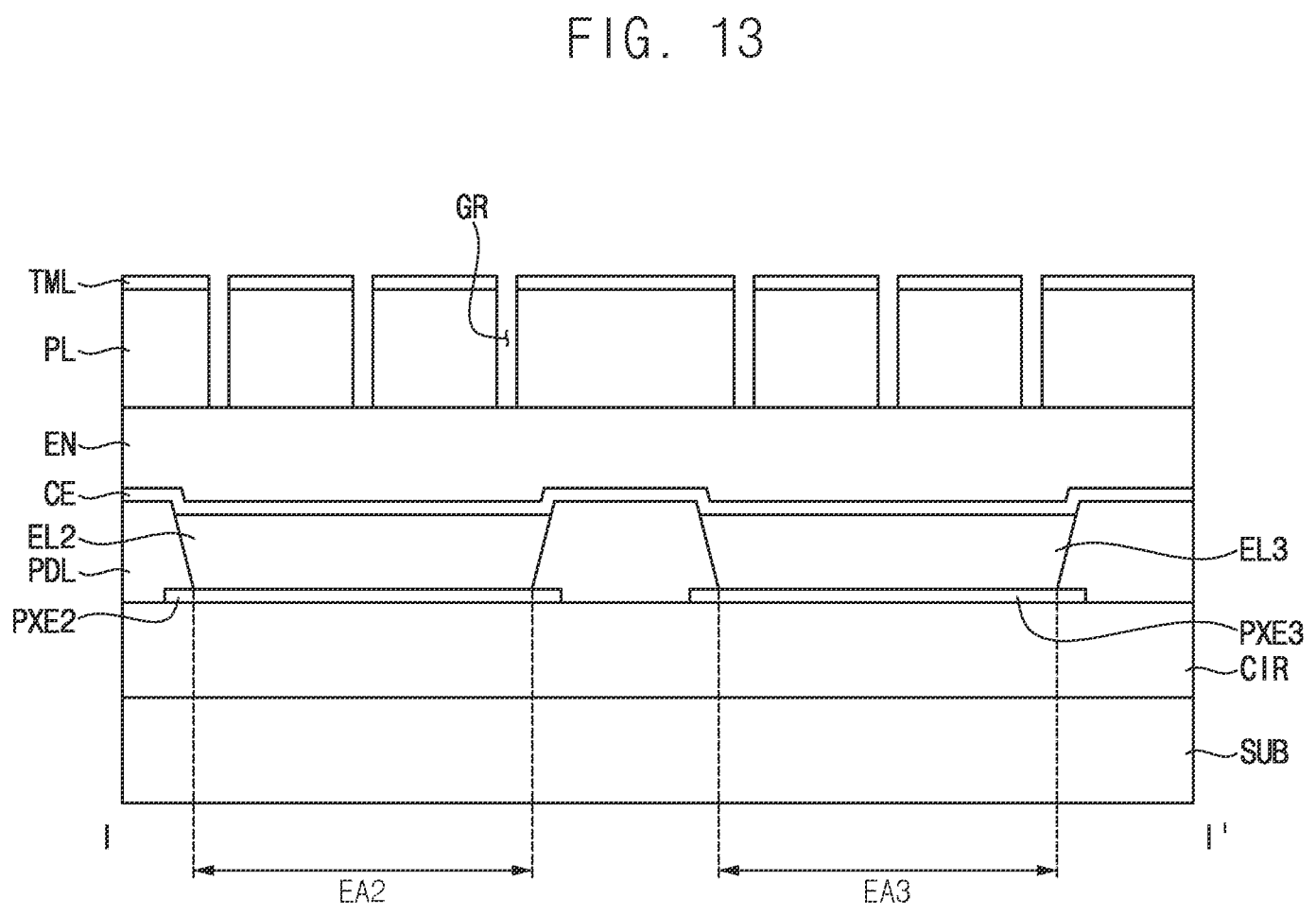

Referring to FIG. 13, the transparent metal layer TML may be used as a mask to remove a part of the preliminary transparent layer P_PL, thereby forming a transparent layer PL. Accordingly, a groove GR may be formed through the transparent metal layer TML and the transparent layer PL. In this process, the groove GR may be formed to correspond to the shape of the light blocking pattern, which has been described with reference to FIGS. 2, 4, 6, 7, 8, and 9.

In an embodiment, for example, the transparent metal layer TML may be used as a mask to remove the part of the preliminary transparent layer P_PL by a dry etching method. In such an embodiment of the disclosure, the preliminary transparent layer P_PL may include a silica-based material and a siloxane-based material, and the part of the preliminary transparent layer P_PL may thus be efficiently removed by a dry etching method.

Figure 14:
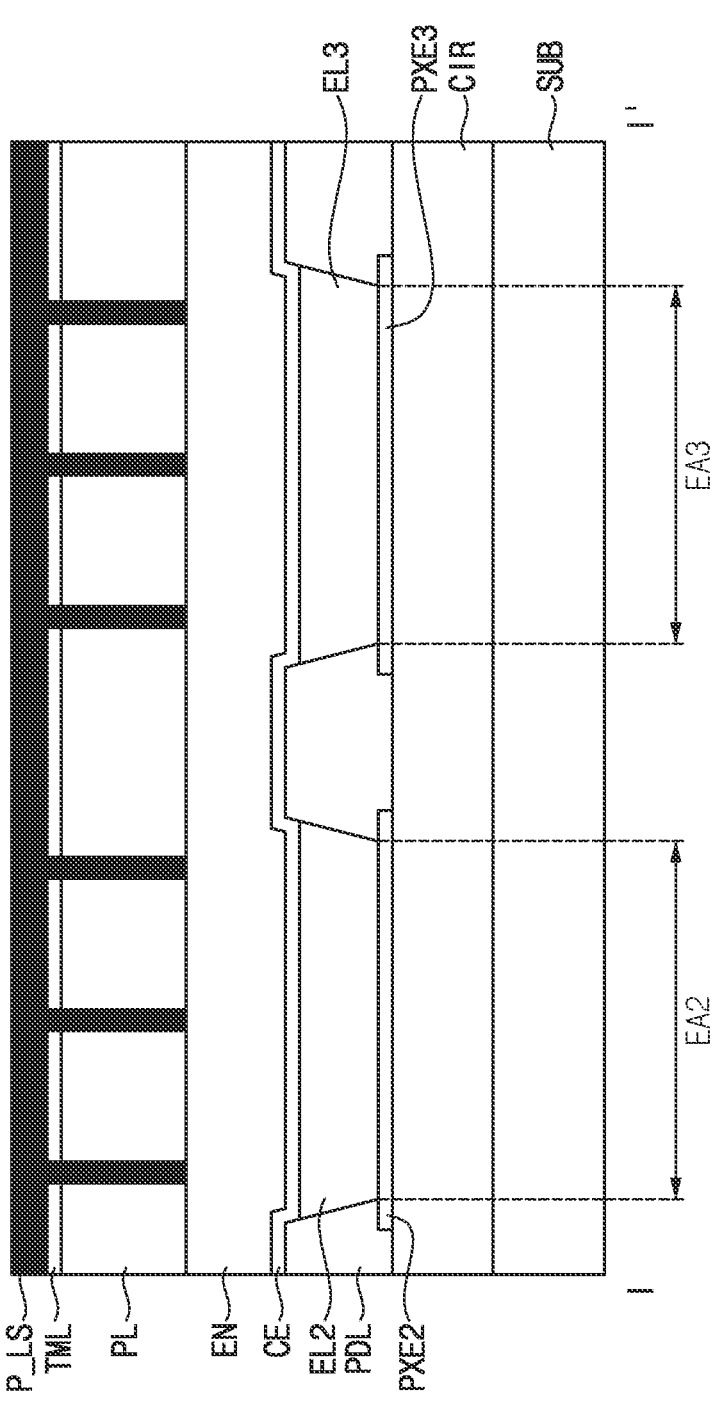

Referring to FIG. 14, after providing or forming the transparent layer PL, a light blocking material P_LS may be applied on the transparent metal layer TML. In this process, the light blocking material P_LS may be filled in the groove GR.

Figure 15:
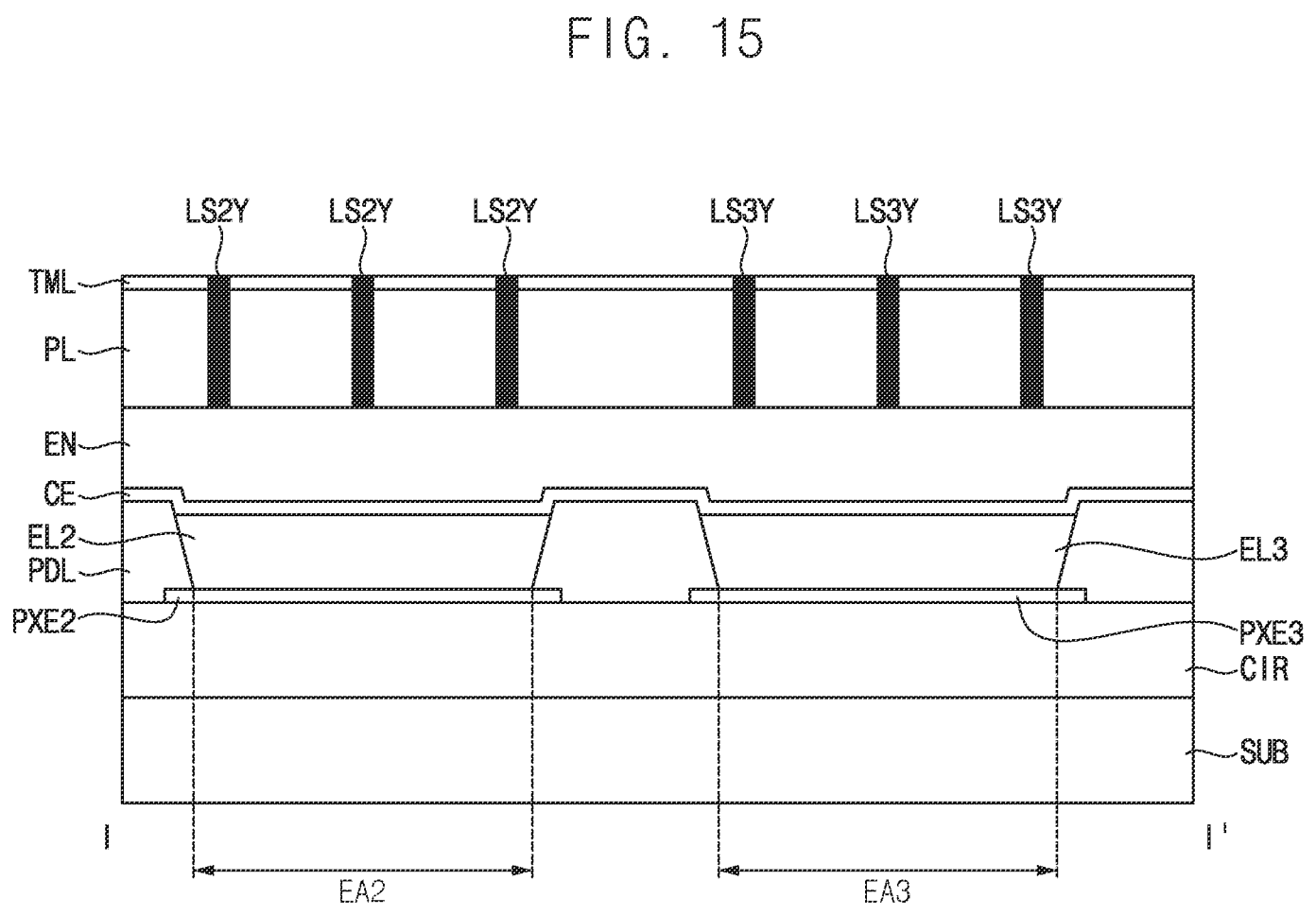

Referring to FIG. 15, after removing portions of the light blocking material P_LS except for those in the groove GR, the light blocking material P_LS in the groove GR may be baked to form light blocking patterns LS2Y and LS3Y. Various known methods may be uses as a method for removing the light blocking material P_LS.

Figure 16:
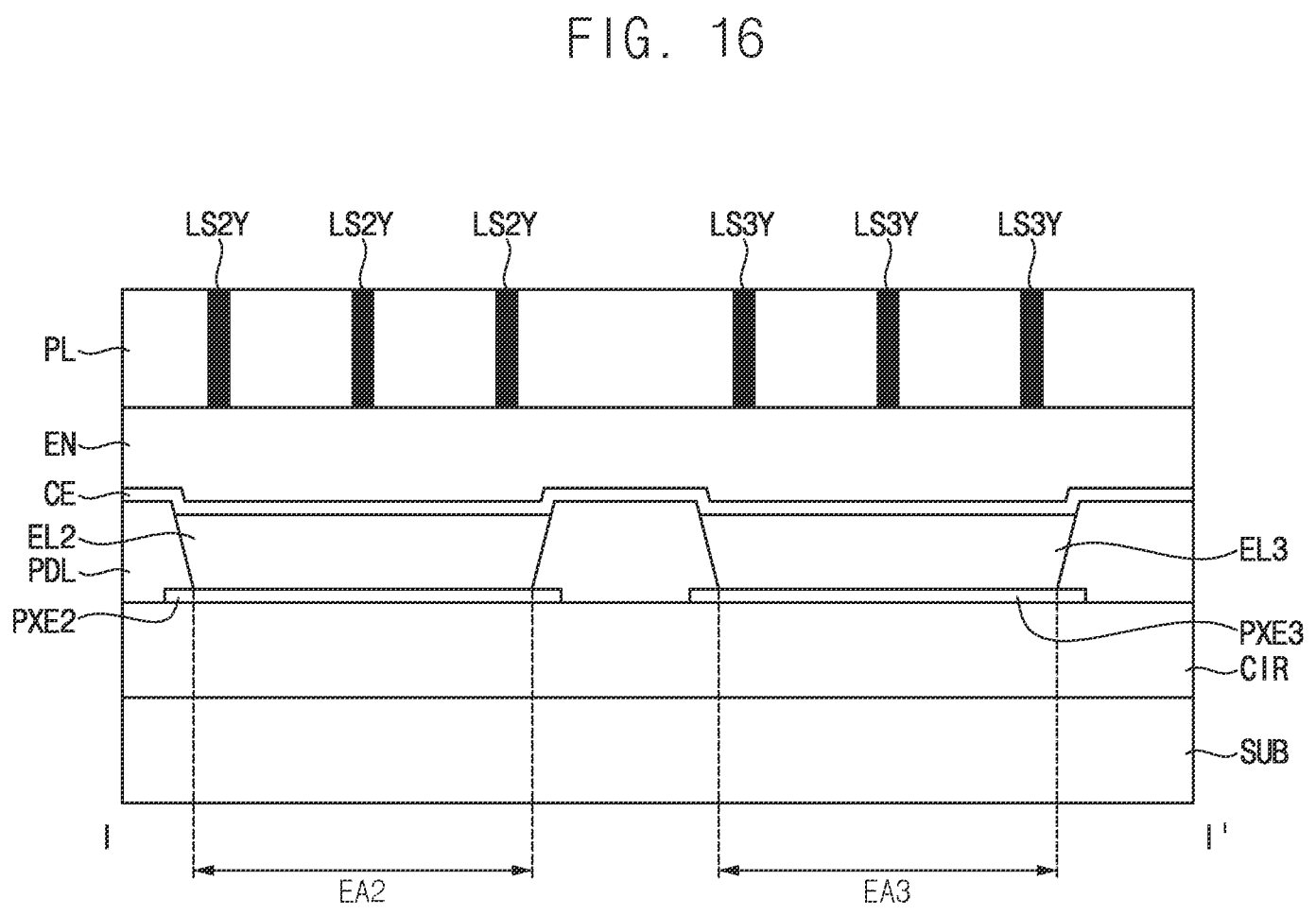

Referring to FIG. 16, after removing the portions of the light blocking material P_LS except for those in the groove GR and the transparent metal layer TML, the light blocking material P_LS in the groove GR may be baked to form the light blocking patterns LS2Y and LS3Y. In these processes, a part of the transparent layer PL (e.g., upper part of the transparent layer PL) and a part of the light blocking material P_LS contained in the groove GR may be simultaneously removed.

Embodiments of the disclosure may be applied to an electronic device including a display device. For example, the disclosure may be applied to various electronic devices such as display devices for vehicles, ships, and aircrafts, portable communication devices, display devices for display or information transmission, medical display devices, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a unit light emitting region;
a transparent layer disposed on the substrate; and
a light blocking pattern defined by a light blocking material filled in a groove defined through the transparent layer,
wherein the light blocking pattern including a first light blocking pattern overlapping the unit light emitting region and extending in a first direction when viewed in a plan view, and a second light blocking pattern overlapping the unit light emitting region and extending in a second direction crossing the first direction when viewed in the plan view, and
wherein the first light blocking pattern is spaced apart from the second light blocking pattern when viewed in the plan view.

2. The display device of claim 1, wherein the unit light emitting region includes:
a red light emitting region;
a green light emitting region spaced apart from the red light emitting region when viewed in the plan view; and
a blue light emitting region spaced apart from each of the red light emitting region and the green light emitting region when viewed in the plan view.

3. The display device of claim 2, wherein
the first light blocking pattern includes a plurality of first red light blocking patterns overlapping the red light emitting region when viewed in the plan view, a plurality of first green light blocking patterns overlapping the green light emitting region when viewed in the plan view, and a plurality of first blue light blocking patterns overlapping the blue light emitting region when viewed in the plan view, and
the second light blocking pattern includes a plurality of second red light blocking patterns overlapping the red light emitting region when viewed in the plan view, a plurality of second green light blocking patterns overlapping the green light emitting region when viewed in the plan view, and a plurality of second blue light blocking patterns overlapping the blue light emitting region when viewed in the plan view.

4. The display device of claim 3, wherein
the plurality of first red light blocking patterns are perpendicular to the plurality of second red light blocking patterns, respectively, when viewed in the plan view,
the plurality of first green light blocking patterns are perpendicular to the plurality of second green light blocking patterns, respectively, in the plan view, and
the plurality of first blue light blocking patterns are perpendicular to the plurality of second blue light blocking patterns, respectively, in the plan view.

5. The display device of claim 1, wherein the substrate includes:
a plurality of pixel electrodes;
a pixel defining layer disposed on the plurality of pixel electrodes, wherein a pixel opening is defined through the pixel defining layer to expose at least a part of each of the plurality of pixel electrodes;
a plurality of light emitting layers disposed on the plurality of pixel electrodes in the pixel opening; and
a common electrode covering the pixel defining layer and the plurality of light emitting layers.

6. The display device of claim 5, wherein each of the first light blocking pattern and the second light blocking pattern overlaps at least a part of the plurality of light emitting layers when viewed in the plan view.

7. The display device of claim 5, wherein the light blocking pattern further includes a third light blocking pattern overlapping the pixel defining layer when viewed in the plan view and spaced apart from the plurality of light emitting layers when viewed in the plan view.

8. The display device of claim 7, wherein the third light blocking pattern is disposed between two adjacent light emitting layers among the plurality of light emitting layers when viewed in the plan view.

9. The display device of claim 1, wherein the first light blocking pattern is integrally formed with the second light blocking pattern as a single unitary and indivisible part.

10. The display device of claim 1, further comprising:
a transparent metal layer disposed on the transparent layer.

11. The display device of claim 10, wherein
the groove is defined further through the transparent metal layer, and
the light blocking pattern is defined by the light blocking material filled in the groove defined through the transparent layer and the transparent metal layer.

12. The display device of claim 1, wherein the transparent layer includes a siloxane-based material or a silica-based material.

13. The display device of claim 12, wherein a content of the silica-based material included in the transparent layer is about 40 wt % or greater and about 70 wt % or less, based on a total weight of the transparent layer.

14. A display device comprising:
a substrate including a unit light emitting region including a red light emitting region, a green light emitting region spaced apart from the red light emitting region when viewed in a plan view, and a blue light emitting region spaced apart from each of the red light emitting region and the green light emitting region when viewed in the plan view;
a transparent layer disposed on the substrate; and
a light blocking pattern defined by a light blocking material filled in a groove defined through the transparent layer,
wherein the light blocking pattern includes a first light blocking pattern overlapping the red light emitting region and a portion of the blue light emitting region when viewed in the plan view, and a second light blocking pattern overlapping the green light emitting region and a portion of the blue light emitting region when viewed in the plan view, wherein the first light blocking pattern extends in a first direction which is diagonal with respect to a side of the red light emitting region and a side of the blue light emitting region.

15. The display device of claim 14, wherein the second light blocking pattern extends in a second direction crossing the first direction.

16. The display device of claim 14, wherein an area of the blue light emitting region when viewed in the plan view is larger than an area of the red light emitting region when viewed in the plan view, and larger than an area of the green light emitting region when viewed in the plan view.

17. The display device of claim 14, wherein the substrate includes:

a plurality of pixel electrodes;

a pixel defining layer disposed on the plurality of pixel electrodes, wherein a pixel opening is defined through the pixel defining layer to expose at least a part of each of the plurality of pixel electrodes;

a plurality of light emitting layers disposed on the plurality of pixel electrodes in the pixel opening; and a common electrode covering the pixel defining layer and the plurality of light emitting layers.

18. The display device of claim 17, wherein each of the first light blocking pattern and the second light blocking pattern overlaps at least a part of the plurality of light emitting layers when viewed in the plan view.

19. The display device of claim 17, wherein the light blocking pattern further includes a third light blocking pattern overlapping the pixel defining layer when viewed in the plan view and spaced apart from the plurality of light emitting layers when viewed in the plan view.

20. The display device of claim 19, wherein the third light blocking pattern is disposed between two adjacent light emitting layers among the plurality of light emitting layers when viewed in the plan view.

21. A display device comprising:

a substrate including a unit light emitting region;

a transparent layer disposed on the substrate; and a plurality of light blocking patterns defined by a light blocking material filled in a groove defined through the transparent layer, wherein the plurality of light blocking patterns includes a portion overlapping the unit light emitting region when viewed in a plan view, extending in a first direction when viewed in the plan view, and arranged so as to be spaced apart from each other in a second direction crossing the first direction when viewed in the plan view, and wherein the portion of the plurality of light blocking patterns overlapping the unit light emitting region extends non-linearly in the first direction when viewed in the plan view.

22. The display device of claim 21, wherein the plurality of light blocking patterns include a first part and a second part, which are arranged in a zigzag manner along the first direction.

23. The display device of claim 21, wherein each of the plurality of light blocking patterns has a wavy shape extending in the first direction.

* * * * *